US010128821B2

United States Patent
Nallamothu

(10) Patent No.: US 10,128,821 B2
(45) Date of Patent: Nov. 13, 2018

(54) LOW OUTPUT IMPEDANCE, HIGH SPEED AND HIGH VOLTAGE GENERATOR FOR USE IN DRIVING A CAPACITIVE LOAD

(71) Applicant: STMicroelectronics, Inc., Coppell, TX (US)

(72) Inventor: Pavan Nallamothu, Little Elm, TX (US)

(73) Assignee: STMicroelectronics, Inc., Coppell, TX (US)

(*) Notice: Subject to any disclaimer, the term of this patent is extended or adjusted under 35 U.S.C. 154(b) by 24 days.

(21) Appl. No.: 15/351,542

(22) Filed: Nov. 15, 2016

(65) Prior Publication Data

US 2018/0138898 A1     May 17, 2018

(51) Int. Cl.
| | |
|---|---|
| H03K 3/00 | (2006.01) |
| H03K 3/012 | (2006.01) |
| H03K 17/687 | (2006.01) |
| G05F 1/575 | (2006.01) |

(52) U.S. Cl.
CPC ............. *H03K 3/012* (2013.01); *G05F 1/575* (2013.01); *H03K 17/687* (2013.01)

(58) Field of Classification Search
CPC .... H03K 3/012; H03K 3/02337; H03K 5/082; H03K 5/02; H03K 17/687; H03K 19/00315; H03K 19/00361; G05F 1/465; G05F 1/575; G05F 3/242; G05F 3/262; G05F 3/265
See application file for complete search history.

(56) References Cited

U.S. PATENT DOCUMENTS

| | | | | |
|---|---|---|---|---|
| 5,867,015 | A * | 2/1999 | Corsi ...................... | G05F 3/242 323/316 |
| 6,587,000 | B2 * | 7/2003 | Oikawa .................. | G05F 3/262 323/315 |
| 2017/0153657 | A1 * | 6/2017 | Yun ......................... | G05F 3/262 |
| 2017/0242448 | A1 * | 8/2017 | Wong ..................... | G05F 1/575 |

\* cited by examiner

*Primary Examiner* — Long Nguyen
(74) *Attorney, Agent, or Firm* — Crowe & Dunlevy

(57) ABSTRACT

A voltage generator circuit uses a feedback loop to regulate an output voltage at an output node. A pair of opposite conductivity source-follower transistors are coupled to the output node. A first one of the source-follower transistors operates to provide a fast current transient for charging a capacitive load that is switchably connected to the output node. A second one of the source-follower transistor operate under feedback control to regulate the voltage level at the output node.

20 Claims, 1 Drawing Sheet

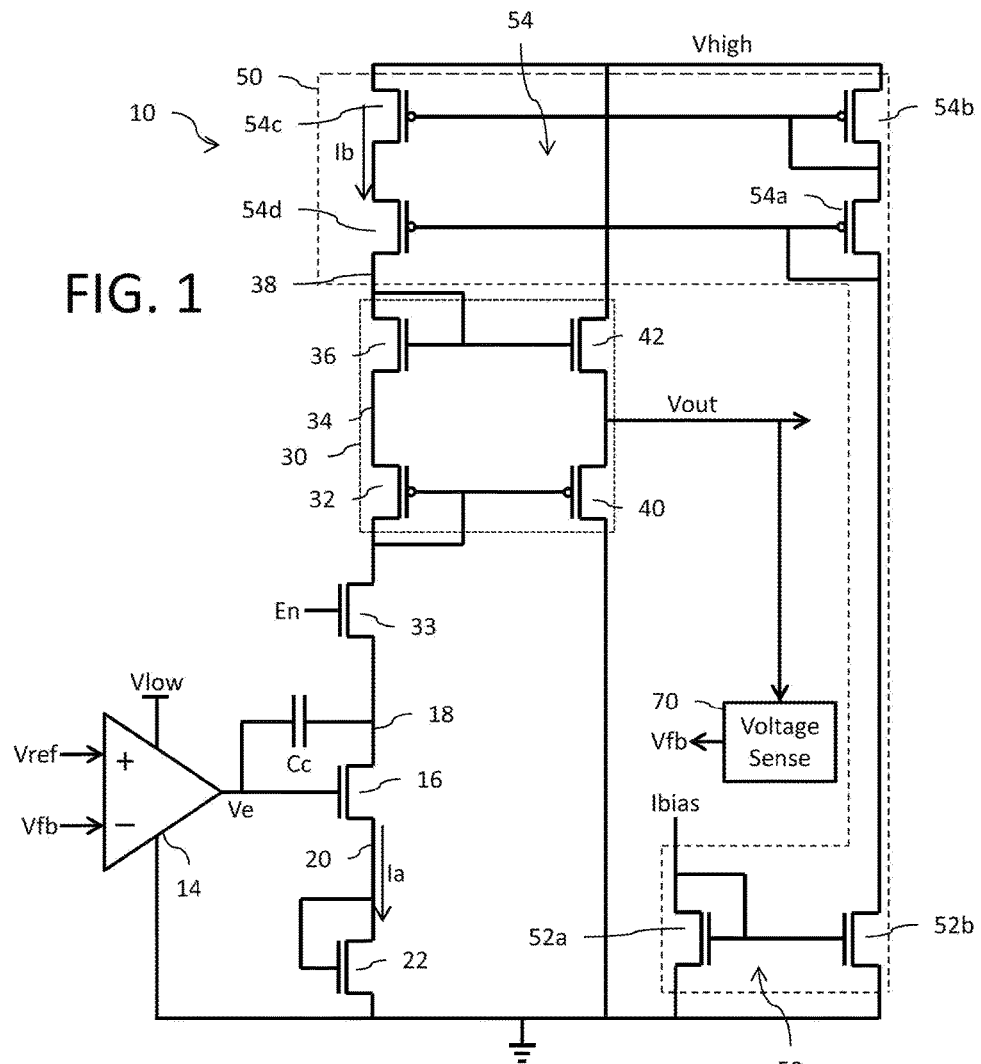
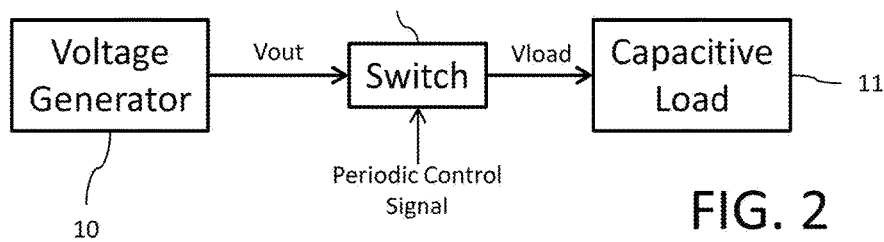

LOW OUTPUT IMPEDANCE, HIGH SPEED AND HIGH VOLTAGE GENERATOR FOR USE IN DRIVING A CAPACITIVE LOAD

TECHNICAL FIELD

The present invention relates to voltage generator circuits and, in particular, to a voltage generator circuit for use in driving a capacitive load with low output impedance, high speed and high voltage.

BACKGROUND

There are a number of system applications where a capacitive load must be driven by a periodic signal with a high voltage level and where that high voltage level must settle to a regulated voltage level very quickly. In other words, the driver must operate to drive the capacitive load from a low voltage to the regulated high voltage with a very fast slew rate. An example of such a capacitive load is the rotor of a gyroscope. High speed gyro rotor excitation requires a regulated drive voltage that is fast enough to charge the capacitive terminals (~10 pF) to the desired high voltage within less than one percent of the excitation frequency of the periodic drive signal (~10 ns) in order to minimize error contribution due to rotor excitation. However, prior art voltage generator circuits used to drive capacitive loads show poor operating performance.

SUMMARY OF THE INVENTION

It is to be understood that both the foregoing general description and the following detailed description are exemplary and explanatory and are intended to provide further explanation of the invention as claimed.

In an embodiment, a voltage generator circuit comprises: a differential amplifier having a first input receiving a reference voltage and a second input receiving a feedback voltage; a first transistor of a first conductivity type having a gate terminal coupled to an output of the differential amplifier and having a drain terminal; a second transistor of a second conductivity type configured as a source-follower with a gate terminal coupled to the drain terminal of the first transistor and a source terminal coupled to a voltage output node; a third transistor of the first conductivity type configured as a source-follower with a gate terminal coupled to bias current node and a source terminal coupled to said voltage output node; and a bias circuit configured to generate a bias current for application to said bias current node.

In an embodiment, a voltage generator circuit comprises: a capacitive output node; a first source-follower transistor of a first conductivity type configured to source current to the capacitive output node; a second source-follower transistor of a second conductivity type configured to sink current from the capacitive output node; a differential amplifier having a first input receiving a reference voltage and a second input receiving a feedback voltage derived from a voltage at the capacitive output node; and wherein said second source-follower transistor is controlled in response to an output of the differential amplifier.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings:

FIG. 1 is a circuit diagram of a voltage generator circuit; and

FIG. 2 is a block diagram for a circuit to drive a capacitive load.

DETAILED DESCRIPTION

FIG. 1 shows a circuit diagram of a voltage generator circuit 10 for generating an output voltage Vout. The circuit 10 includes a differential amplifier circuit 14 having a non-inverting (+) input configured to receive a reference voltage Vref and an inverting (−) input configured to receive a feedback voltage Vfb. The differential amplifier circuit 14 is powered from a low supply voltage Vlow. The reference voltage Vref is preferably generated using a bandgap reference voltage generator. The output signal Ve of the differential amplifier circuit 14 is a voltage having a magnitude equal to the amplified difference between Vref and Vfb. The output signal Ve is applied to the control terminal (gate) of an n-channel metal oxide semiconductor field effect transistor (MOSFET) 16 to generate a current Ia at node 18 that flows through the source-drain path of transistor 16. A first conduction terminal (drain) of the transistor 16 is coupled to node 18. A second conduction terminal (source) of the transistor 16 is coupled to node 20. A compensation capacitor Cc is coupled between node 18 and the output of the amplifier 14. A diode-connected transistor 22 is coupled between node 20 and a ground (Gnd) node. The diode-connected transistor 22 is an n-channel MOSFET with its source coupled to ground and its drain coupled to node 20 and to the gate of transistor 22. Thus, the source-drain path of transistor 22 is coupled in series with the source-drain path of transistor 16 at node 20. This diode-connected transistor 22 is provided to set the minimum bias voltage at the gate of transistor 16 to 2*Vt.

The voltage generator circuit 10 further includes a high voltage, low impedance output circuit 30 coupled between node 18 and the output voltage Vout node. The circuit 30 includes a p-channel MOSFET transistor 32 having a drain coupled to node 18 through an n-channel MOSFET transistor switch 33 and a source coupled to intermediate node 34. The gate of transistor 32 is coupled to the drain of transistor 32 at node 18, and thus transistor 32 is a diode-connected transistor. The circuit 30 further includes an n-channel MOSFET transistor 36 having a drain coupled to node 38 and a source coupled to intermediate node 34. The gate of transistor 36 is coupled to the drain of transistor 36 at node 38, and thus transistor 36 is a diode-connected transistor. The source-drain paths of transistors 32 and 36 are accordingly coupled in series at intermediate node 34, and further coupled in series with the source-drain paths of transistors 16 and 22 to form an input leg of the circuit 30.

The on/off state of the transistor switch 33 is controlled by an enable signal (EN). The transistor switch 33 separates the high voltage devices of the circuit 30 from the low voltage devices (transistors 16 and 22) and thus protects the low voltage devices from an overvoltage condition.

The circuit 30 further includes a p-channel MOSFET transistor 40 having a drain coupled to the ground node and a source coupled to the output voltage Vout node. The gate of transistor 40 is coupled to the gate of transistor 32. The transistor 40 is configured as a source-follower. The circuit 30 further includes an n-channel MOSFET transistor 42 having a drain coupled to a high voltage power supply voltage (Vhigh) node and a source coupled to the output voltage Vout node. The gate of transistor 44 is coupled to the gate of transistor 36. The transistor 42 is configured as a source-follower. The source-drain paths of transistors 40 and 42 are thus coupled in series at the output voltage node and form an output leg of the circuit 30.

The high voltage power supply voltage (Vhigh) node is greater than the low supply voltage Vlow (for example, Vhigh may be 20V and Vlow may be 3V). In an embodiment, the high voltage power supply voltage Vhigh is generated using a charge pump circuit (not shown) from the low supply voltage Vlow.

A bias circuit 50 operates to source a bias current Ib to bias the high voltage, low impedance output circuit 30. The bias circuit 50 receives a reference bias current Ibias that is mirrored by an n-channel MOSFET transistor current mirror 52 (with transistors 52a, 52b) and p-channel cascode MOSFET current mirror 54 (with transistors 54a, 54b, 54c, 54d) to output the bias current Ib. The bias circuit 50 is also coupled to the high voltage power supply voltage (Vhigh) node. In DC operation, Ia=Ib.

The transistors 32 and 40 form an nMOS current mirroring circuit. Likewise, the transistors 36 and 42 form a pMOS current mirroring circuit. The bias voltages at the connected gate terminals of nMOS and pMOS current mirroring circuits are set by the voltage at the output voltage node (Vout) and the currents Ia and Ib. The transistors 40 and 42 provide a low impedance output and function, responsive to the current Ia and Ib, respectively, to sink current from and source current to the output voltage node. As a result, the fast current transients needed to quickly charge a capacitive load are available at the output voltage node.

A voltage sensing circuit 70 is coupled to the sense the output voltage Vout at the output voltage Vout node and operates to generate therefrom the feedback voltage Vfb. The voltage sensing circuit 70 may, for example, comprise a resistive voltage divider circuit. In one implementation, the voltage division ratio has a fixed value. In another implementation, the voltage division ratio is variable. The voltage division ratio sets the value of the regulated voltage at the output voltage Vout node. In an embodiment, the output voltage Vout may have a regulated value of approximately, 4V. Adjustment of the voltage division ratio can be used to select other voltage levels of, for example, 10V or 15V (assuming a sufficient voltage level for the high voltage power supply voltage Vhigh).

Reference is now made to FIG. 2 showing a block diagram for a circuit to drive a capacitive load 11. The voltage generator circuit 10 outputs the output voltage Vout and is connected to a first terminal of a switching circuit 12. A second terminal of the switching circuit 12 is coupled to the capacitive load 11. The open/closed state of the switching circuit 12 is controlled by a periodic control signal. When the periodic control signal is asserted, the switching circuit 12 is closed and the capacitive load is charged by the output voltage Vout from the voltage generator circuit 10. The output voltage Vout node of the voltage generator circuit 10 has low output impedance due to the source follower configuration provided by transistors 40 and 42. Because of the low output impedance, fast current transients are generated to quickly charge the capacitive load 11. The voltage at the load Vload will accordingly rise quickly. The negative feedback through the voltage sense circuit 70 and amplifier 14 regulates the output voltage Vout and thus also regulates the load voltage Vload.

In operation, consider the initial condition where the capacitive load 11 is connected by switch 12 to the output voltage node and the circuit 10 needs to charge the capacitor to a desired output voltage. The voltage at the output voltage node starts at 0V. The transistor 42 has a large Vgs and accordingly sources a high current to quickly charge the capacitive load. The voltage at the output voltage node rises in response to the current sourced by transistor 42. As the voltage on the capacitor rises toward the desired output voltage, the Vgs of transistor 42 begins to collapse. The fast transient response of the circuit 30 reduces. Once sufficient voltage is present at the output voltage node, the negative feedback through amplifier 14 and transistor 40 stabilizes the output voltage at the desired output voltage value. The voltage division ratio set by the voltage sense circuit 70 sets the desired output voltage value.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A voltage generator circuit, comprising:
a differential amplifier having a first input receiving a reference voltage and a second input receiving a feedback voltage;
a first transistor of a first conductivity type having a gate terminal coupled to an output of the differential amplifier and having a drain terminal;
a second transistor of a second conductivity type configured as a source-follower with a gate terminal coupled to the drain terminal of the first transistor and a source terminal coupled to a voltage output node;
a third transistor of the first conductivity type configured as a source-follower with a gate terminal coupled to a bias current node and a source terminal coupled to said voltage output node; and
a bias circuit configured to generate a bias current for application to said bias current node.

2. The voltage generator circuit of claim 1, further comprising:
a fourth transistor of the second conductivity type configured as a diode-connected device with a gate terminal and drain terminal coupled to the drain terminal of the first transistor; and
a fifth transistor of the first conductivity type configured as a diode-connected device with a gate terminal and drain terminal coupled to bias current node.

3. The voltage generator circuit of claim 2, wherein a source terminal of the fourth transistor is coupled to a source terminal of the fifth transistor at an intermediate node.

4. The voltage generator circuit of claim 1, further comprising an additional transistor having a gate terminal and a drain terminal coupled to the first transistor and a source terminal coupled to a ground reference.

5. The voltage generator circuit of claim 1, wherein a drain terminal of the second transistor is coupled to a ground reference and a drain terminal of the third transistor is coupled to a supply voltage.

6. The voltage generator circuit of claim 1, further comprising a voltage sense circuit coupled to the voltage output and configured to generate said feedback voltage as a function of a sensed voltage at the voltage output node.

7. A device, comprising:
the voltage generator circuit of claim 1;
a capacitive load; and a switching circuit configured to selectively connect the voltage output to the capacitive load.

8. The device of claim 7, wherein selective connection by the switching circuit is driven in response to a periodic control signal.

9. The device of claim 7, further comprising:
a fourth transistor of the second conductivity type configured as a diode-connected device with a gate terminal and drain terminal coupled to the drain terminal of the first transistor; and
a fifth transistor of the first conductivity type configured as a diode-connected device with a gate terminal and drain terminal coupled to bias current node.

10. The device of claim 9, wherein a source terminal of the fourth transistor is coupled to a source terminal of the fifth transistor at an intermediate node.

11. The device of claim 7, further comprising an additional transistor having a gate terminal and a drain terminal coupled to the first transistor and a source terminal coupled to a ground reference.

12. The device of claim 7, wherein a drain terminal of the second transistor is coupled to a ground reference and a drain terminal of the third transistor is coupled to a supply voltage.

13. The device of claim 7, further comprising a voltage sense circuit coupled to the voltage output and configured to generate said feedback voltage as a function of a sensed voltage at the voltage output node.

14. A voltage generator circuit, comprising:
a capacitive output node;
a first source-follower transistor of a first conductivity type configured to source current to the capacitive output node;
a second source-follower transistor of a second conductivity type configured to sink current from the capacitive output node;
a differential amplifier having a first input receiving a reference voltage and a second input receiving a feedback voltage derived from a voltage at the capacitive output node; and
wherein said second source-follower transistor is controlled in response to an output of the differential amplifier.

15. The circuit of claim 14, wherein the first conductivity type is n-type and the second conductivity type is p-type.

16. The circuit of claim 14, further comprising:
a first diode-connected transistor coupled in a current mirroring configuration with the first source-follower transistor; and
a second diode-connected transistor coupled in a current mirroring configuration with the second source-follower transistor.

17. The circuit of claim 16, wherein said first and second diode-connected transistors have source-drain paths coupled in series.

18. The circuit of claim 17, further comprising current source circuit configured to source current to the first diode-connected transistor.

19. The circuit of claim 17, further comprising a transistor having a source-drain path coupled in series with the source-drain path of the second diode-connected transistor, and wherein a control terminal of said transistor is coupled to the output of the differential amplifier.

20. The circuit of claim 14, wherein the first source-follower transistor is controlled in response to a bias current.

* * * * *